United States Patent [19]
Lafond

[11] Patent Number: 5,884,392
[45] Date of Patent: Mar. 23, 1999

[54] AUTOMATIC ASSEMBLER/DISASSEMBLER APPARATUS ADAPTED TO PRESSURIZED SEALABLE TRANSPORTABLE CONTAINERS

[75] Inventor: Andre Lafond, Saint Georges, France

[73] Assignee: International Business Machines Corporation, Armonk, N.Y.

[21] Appl. No.: 618,021

[22] Filed: Mar. 25, 1996

Related U.S. Application Data

[62] Division of Ser. No. 363,144, Dec. 23, 1994.

[51] Int. Cl.$^6$ ..................................................... B23P 21/00
[52] U.S. Cl. ............................................... 29/722; 29/822
[58] Field of Search ............................... 29/722, 771, 786, 29/809, 827

[56] References Cited

U.S. PATENT DOCUMENTS

| | | | |
|---|---|---|---|
| 3,516,386 | 6/1970 | Landwehr et al. | 29/809 X |
| 4,532,970 | 8/1985 | Tullis et al. | 141/98 |
| 4,587,703 | 5/1986 | Azizi et al. | 29/786 X |
| 4,923,352 | 5/1990 | Tamura et al. | 29/722 X |
| 4,999,671 | 3/1991 | Iizuka | 355/97 |
| 5,388,945 | 2/1995 | Garric et al. | 414/217 |

FOREIGN PATENT DOCUMENTS

| | | | |
|---|---|---|---|
| 229244 | 7/1987 | European Pat. Off. | 29/771 |

*Primary Examiner*—Joseph M. Gorski
*Attorney, Agent, or Firm*—Aziz M. Ahsan

[57] ABSTRACT

Disclosed is an automatic container assembler apparatus (800) to assemble the constitutive elements of a COAST container i.e. the wafer (138) that is to be treated in the manufacturing line, the cassette-reservoir (123) and the single wafer holder (130). In essence, the assembler apparatus consists of a cabinet whose interior space cabinet is submitted to a clean filtered gas flow generated by a blower, so that a clean gaseous mini-environment is created therein with a light overpressure with regard to the outside ambient. The cabinet includes a vertical stocker (804) adapted to be manually and safely filled with the adequate number of the elements mentioned above. Generally, the wafers are carried in a multiple wafer holder (130'). These elements are introduced in the cabinet through an input loadlock device (810) and laid down onto a table (806) by an operator. Next, the operator places them in their respective bins (815) of the stocker through manipulation gloves (805). The cabinet is provided with an automatic manipulator mechanism (807) for automatically and successively grasping one element of each type before proceeding to their complete assembly in a load loadlock device (808). The manipulator mechanism essentially consists of a rotating head (822) movable in the X, Y and Z directions and provided with a plurality of handling grippers (822A to C), each being adapted to a specific element. Once these elements have been properly assembled to form a container, the interior space thereof is pressurized with an ultra pure neutral gas. Moreover, the load loadlock device is also adapted to release the assembled pressurized container onto the IN station (402-I) of the extra-bay conveyor (402) of the COAST manufacturing line and to simultaneously provide identification data to the host computer controlling said line. Similar reasoning applies to the disassembler apparatus which has a quite similar construction and performs the steps in reverse.

17 Claims, 7 Drawing Sheets

AUTOMATIC ASSEMBLER/DISASSEMBLER APPARATUS ADAPTED TO PRESSURIZED SEALABLE TRANSPORTABLE CONTAINERS

This Patent Application is a Divisional Patent Application of U.S. patent application Ser. No. 08/363,144, filed on Dec. 23, 1994.

FIELD OF THE INVENTION

The present invention relates to automatic handling systems and more particularly to automatic assembler/disassembler apparatus adapted to pressurized sealable transportable containers. Once assembled and pressurized, such containers are capable of storing a workpiece, typically a semiconductor wafer, in a protective gaseous environment having a positive differential pressure with the outside ambient. As a result, ingress of contaminants in the container is prevented.

CROSS-REFERENCE TO COPENDING PATENT APPLICATIONS

Pressurized sealable transportable containers for storing a semiconductor wafer in a protective gaseous environment, European Patent Application No. 93480109.5, filing date Aug. 4, 1992, which corresponds to U.S. patent application Ser. No. 101,599.

Pressurized interface apparatus for transferring a silicon wafer between a pressurized sealable transportable container and a processing equipment; European Patent Application Number 92480111.1, filing date Aug. 4, 1992, which corresponds to U.S. patent application Ser. No. 102,076.

Dispatching apparatus with a gas distribution system for handling and storing pressurized sealable transportable containers; European Patent Application Number 92480110.3, filing date Aug. 4, 1992, which corresponds to U.S. patent application Ser. No. 102,075.

Fully automated and computerized conveyor based manufacturing line architectures adapted to pressurized sealable transportable containers; European Patent Application No. 92480112.9, filing date Aug. 4, 1992, which corresponds to U.S. patent application Ser. No. 101,608, which issued on Feb. 14, 1995, as U.S. Pat. No. 5,388,945.

The first application is directed to a family of pressurized sealable transportable containers. A container (preferably provided with a wafer holder) stores a single semiconductor wafer in a protective gaseous environment having a positive differential pressure with the outside ambient (e.g. the atmosphere). It is the essential constituent of this group of four inventions.

The second application is directed to a family of pressurized interface apparatus for interfacing the container and a processing equipment (or tool). The role of the interface apparatus is to transfer said wafer from the container into a processing equipment for treatment and vice-versa, without breaking said protective gaseous environment.

The third application is directed to a family of dispatching apparatus with a gas distribution system for handling and storing the containers during the wafer idle times between different processing steps while still maintaining said protective gaseous environment.

The fourth application is directed to the optimal integration of above elements with conventional conveyor means and a computer system to result in a fully automated and computerized manufacturing line which is modular, flexible and fully compatible with the Continuous Flow Manufacturing (CFM) concept in a Computer Integrated Manufacturing (CIM) environment.

The disclosure of all of the above-mentioned four patent applications are incorporated herein by reference.

There are three major principles at the base of these inventions.

1. In essence, the container is adapted to store a single semiconductor wafer. The present trend in advanced semiconductor wafer processing is to evolve towards the Single Wafer Treatment (SWT) for process uniformity and quality reasons. In particular, single wafer processing equipments are extensively used for the steps of Plasma Enhanced Chemical Vapor Deposition (PECVD), Reactive Ion Etching (RIE), Rapid Thermal Anneal (RTA) and the like.

2. Except of course during treatment in the processing equipments, the semiconductor wafer is permanently surrounded by a protective gaseous environment having a static pressure higher than the one of the outside ambient. To that end, the container is filled with a compressed ultra pure neutral gas, which is rejuvenated whenever required. As a result, ingress of contaminants in the container is prevented.

3. The container, the interface apparatus and the dispatching apparatus have all been specially designed for perfect fitting with conventional conveyors. The latter are widely recognized as a convenient and inexpensive transportation system, fully adapted to mechanical automation and computerization.

In that respect, the inventor has thus conceived and developed a new manufacturing concept, which is basically described by COAST or Contamination-free, global Automation, Single workpiece/wafer Treatment. This new concept will henceforth be referred to by the acronym COAST.

DESCRIPTION OF THE PRIOR ART

Semiconductor wafers (hereinafter referred to as "wafers") are the base material for the production of VLSI chips. Wafers, usually stored in carriers or jigs, may only be handled and transported in extremely clean environments, because even minute dirt or dust particles render them unusable for further processing. Therefore, control of particulate contamination is imperative for cost effective, high-yield and profitable manufacturing of VLSI chips. Because design rules increasingly call for smaller lines definition, it is necessary to exert greater control on the number of particles and to remove particles with even diminishing sizes. For instance, these particles may cause incomplete etching in spaces between conductive lines which in turn, result in electrical failures in the final chips. The main sources of particulate contamination are personnel, equipments, installation (including clean rooms) and chemicals, but particles given off by personnel and clean room facilities are certainly the most important source. On the other hand, there is another type of contamination, the so-called chemical contamination. The presence of molecules of chemical compounds in the atmosphere is also a source of contamination, and in particular, molecules of solvents have a detrimental effect on the resist layers during their exposition to deep UV radiations.

To date, clean rooms (where all the processing steps are performed) are extensively used in the semiconductor wafer manufacturing. For instance, in a conventional class 1 rated clean room, the wafers are transported in a jig, from one process area to another process area of the clean room, generally without any further protection. Transportation is thus a first cause of wafer contamination, mainly because the presence of personnel. As a consequence, all processing equipments being installed in the clean room, such clean rooms are generally of large volume and have a lot of inconveniences. First of all, chemical contamination control in recycled air is a dramatic challenge because of the complex and costly installation thus required. Moreover, exploitation and maintenance costs of these clean rooms become really prohibitive. Note also, the low flexibility of the manufacturing lines constructed in clean rooms, because existence of walls, floors, conditioning systems, . . . etc. Finally, the tracking and management of the wafers being processed in the manufacturing lines by the host computer of the Floor Control System (FCS) are difficult and require many manual operations. As a result, large volume clean rooms rated class <1 appear to be impossible to build at a reasonable cost.

This problem has been partially overcome according to the so-called mini clean room concept, based on ultra-clean mini-environments (e.g. class 1) for both wafers and processing equipments. Basically, the wafers still stored in a jig, are transported and momentarily stored in improved and clean enclosures. The ultra-cleanliness requirements are thus limited only to the mini-environments while the remaining parts of the clean room is of average cleanliness (e.g. class 10–100). It is to be noted that this approach significantly eliminates the particulate contamination but the problem of chemical contamination is still not addressed, as it will be explained hereinbelow.

The major technical contribution to this approach, is known under the brand name of the Standardized Mechanical Inter-Face (SMIF) concept.

The SMIF concept was first described in the article "SMIF: a technology for wafer cassette transfer in VLSI manufacturing", by Mihir Parikh and Ulrich Kaempf, Solid State Technology, July 1984, pp. 111–115. Further details can also be found in patent specifications of U.S. Pat. No. 4,532,970 and U.S. Pat. No. 4,534,389, both assigned to Hewlett-Packard Corp., U.S.A. In essence, according to the fundamentals of the SMIF concept, the proposal consists to have a plurality of wafers permanently surrounded by a still gaseous ambient in a clean enclosure during transport and the storage of the wafers. The wafers are processed in a processing equipment whose access is controlled by an interface device. The wafers are introduced in the processing equipment through said interface device, which is surrounded by a clean atmosphere. A portable wafer mini-environment and processing equipment interface apparatus enclosed in a mini-environment are therefore the two essential characteristics of the SMIF concept.

The clean enclosure, usually referred to as the SMIF box, basically consists of a box top or cover sealingly mating with a box base for hermetic and tight sealing, which encloses the wafer jig. A standard jig carries about 25 or so wafers, each wafer having a diameter of about 20 cm. Generally, the wafers are stored in a carrier which in turn, is wrapped in a vacuum sealed plastic pocket for contamination protection and is delivered "as such" by the wafer supplier. Likewise, the jigs and the SMIF boxes are delivered by their respective suppliers, wrapped in similar plastic pockets. In a clean room, the plastic pockets of these components are un-wrapped, the wafers stored in the jig and the jig secured in the SMIF box, which thus plays the role of a transport box. All these operations are performed manually. The gaseous media surrounding the wafers in the SMIF box thus results from the specific ambient which prevailed at the time the wafer jig was enclosed within the said SMIF box. As a result, the wafers in the SMIF box are not well protected from chemical contaminants, unlike the wafer in the COAST container, because it is enclosed in an ultra-pure pressurized neutral gas. One may now speak of the notion of micro-environment as far as the COAST container is concerned.

The SMIF box is now ready for processing. Conventionally, the SMIF box is manually transported from one processing equipment to another or from the storage station to one processing equipment and vice versa. Alternatively, the standard SMIF systems may preferably include an automatic transportation and handling system, typically a robotic vehicle, usually referred to as the Automated Guided Vehicle (AGV) controlled by the FCS through a wireless link. Generally, with standard SMIF boxes, even provided with an intermediate liner, the wafers are not totally clamped and they may move a little. Because, the operations of loading/unloading the AGV are a source of shocks, the SMIF boxes are not totally protected against particulate contamination. Whenever a SMIF box is disturbed by bumping for example, many small particles are freed from the wafer surface and find their way as potential contaminants. Obviously, the greatest the number of wafers stored in the SMIF box, the most likely this particulate contamination occurs.

The SMIF box is placed at the port of an interface device, referred to as the canopy, generally at the top of it, forming an hermetic seal therewith. Then, the jig containing the wafers is withdrawn from the SMIF box and transferred by an elevator/manipulator assembly to the close vicinity of the processing equipment port. Next, the wafers are extracted from the jig and introduced in the processing equipment chamber, either manually by an operator via a manipulation glove or automatically using a loading/unloading robot.

Thus, the base SMIF box can be carried in a non-clean atmosphere to an appropriate processing equipment where the wafers are processed in a controlled clean environment without contamination and without having to make the entire manufacturing facility clean.

The COAST approach is in line with the SMIF concept, but significant improvements have been made to the enclosure (which is now pressurized with an ultra pure neutral gas), to the interface device or canopy and to the storage station. Still according to the COAST concept, the AGV is no longer required because it has been replaced by a conveyor system.

BRIEF SUMMARY OF THE INVENTION

Basically, the present invention is directed to an additional equipment to further improve the efficiency of any manufacturing line built in accordance to the teachings of the COAST concept. The equipment first includes an automatic assembler apparatus capable of automatically performing the operations of (1) assembling the essential container elements, i.e. the wafer, the wafer holder and the cassette-reservoir to produce the assembled container, (2) pressurizing it and, (3) loading the assembled pressurized container onto a conveyor.

The assembler apparatus is also preferably provided with means for identifying the wafer and/or the container and for data initialization of the FCS, either prior or simultaneously to operation (3) of loading.

In essence, the assembler apparatus consists of a cabinet comprised of two compartments separated by a partition-wall. The whole interior space of the cabinet is submitted to a clean filtered gas flow generated by a blower, so that a clean gaseous mini-environment is created therein with a light overpressure with regard to the outside ambient. The cabinet is first adapted to be manually and safely filled with the adequate number of the container elements mentioned above. The raw components which contain these elements are introduced in the cabinet through an input loadlock device and laid down onto a table by an operator. Next, the operator extracts the elements therefrom and places them in their respective bins of an elevator through manipulation gloves.

Generally, the wafers are carried in a multiple wafer holder or any commercial jig. The cabinet is provided with an automatic manipulator mechanism for automatically and successively grasping one element of each type before proceeding to their complete assembly in a load loadlock device. The manipulator mechanism essentially consists of a rotating head movable in the X, Y and Z directions and provided with a plurality of handling grippers, each being adapted to a specific element. Once these elements have been properly assembled to form a container, the interior space thereof is pressurized with an ultra pure neutral gas. Moreover, the load loadlock device is also adapted to release the assembled pressurized container onto the IN station of an extra-bay conveyor of the manufacturing line and to provide identification data to the host computer of the FCS for process initialization.

The equipment of the present invention also encompasses an automatic disassembler apparatus capable of automatically performing the reverse operations of unloading the assembled pressurized container from the conveyor and disassembling it to recover the treated wafer (for further processing) and the others elements of the container for cleaning. However, the assembler and disassembler apparatus may be combined in a single assembler/disassembler apparatus for increased efficiency and cost reduction.

Therefore, in one aspect this invention comprises of an assembler apparatus (800) for automatically assembling elements of a COAST container (100); and pressurizing said assembled COAST container before releasing it onto a conveyor (402) of a manufacturing line (15); said apparatus (800) being operable in an average cleanliness room comprising:

a cassette-reservoir (123), a single wafer holder (130), and a semiconductor wafer (138), all being elements of said COAST container (100);

a cabinet (801), having a front wall, a back wall, and two side walls defining at least one compartment (802);

vertical stocker means (804), mounted inside said cabinet that is provided with different types of bins (815), wherein each of said bins being adapted to a type of said elements of said COAST container;

input loadlock means (810), for introducing said elements of said COAST container within said cabinet from the outside;

manipulating means (805), for manipulating said elements inside said cabinet and in particular for accurately placing said elements into their respective bins of the said stocker means;

a load loadlock mechanism (808), mounted inside said cabinet and interfacing with the outside thereof at the vicinity of said conveyor;

an automatic manipulator mechanism (807), inside the cabinet for automatically and successively grasping an element of each type from its respective bin of the said stocker means in the order mentioned above which cooperates with said load loadlock mechanism for their automatic assembly, to finally produce an assembled container in the said load loadlock mechanism, and thereby said assembler apparatus automatically assembles elements of said COAST container.

In another aspect this invention comprises of a disassembler apparatus (800'), for automatically disassembling a pressurized assembled COAST container (100), coming from a conveyor (402) of a manufacturing line (15); said apparatus (800') being operable in an average cleanliness room comprising:

a cassette-reservoir (123), a single wafer holder (130), and a semiconductor wafer (138), all being elements of said COAST container (100);

a cabinet (801'), having a front wall, a back wall, and two side walls defining at least one compartment (802');

an unload loadlock mechanism (808'), interfacing with the outside of said cabinet at the vicinity of said conveyor (402) and provided with a transport mechanism (827', 839') for transporting said assembled pressurized COAST container (100) from an IN station (402-I), of said conveyor (402) to its interior;

vertical stocker means (804') mounted inside said cabinet that is provided with different types of bins (815'), wherein each of said bins being adapted to a type of said elements of said COAST container;

an automatic manipulator mechanism (807'), inside said cabinet adapted to cooperate with the said unload loadlock mechanism for automatically disassembling said COAST container, by successively grasping elements of each type of said COAST container and placing them in their respective bins in said stocker means, and thereby said disassembler apparatus automatically disassembles said pressurized assembled COAST container.

PURPOSES OF THE INVENTION

Therefore, it is a primary purpose of the present invention to provide an automatic assembler(disassembler) apparatus for pressurized sealable transportable containers capable of assembling(disassembling) the container base elements: i.e. the cassette reservoir, the wafer holder and the wafer.

It is another purpose of the present invention to provide an automatic assembler apparatus for pressurized sealable transportable containers storing a single semiconductor wafer including means adapted to produce a microenvironment therein.

It is another purpose of the present invention to provide an automatic assembler apparatus for pressurized sealable transportable containers storing a single semiconductor wafer including means for connecting the container to a compressed neutral gas supply installation to pressurize the interior space thereof.

It is another purpose of the present invention to provide an automatic assembler apparatus for pressurized sealable transportable containers storing a single semiconductor wafer wherein said neutral gas is ultra pure to avoid any chemical contamination of the wafer.

It is another purpose of the present invention to provide an automatic assembler(disassembler) apparatus for pressurized sealable transportable containers storing a single semiconductor wafer which is adapted to fully automated and computerized conveyor based manufacturing lines.

It is another purpose of the present invention to provide an automatic assembler(disassembler) apparatus for pressurized sealable transportable containers storing a single semiconductor wafer that also allows the automatic loading (unloading) of the assembled pressurized container, onto (from) the conveyor.

It is another purpose of the present invention to provide an automatic assembler(disassembler) apparatus for pressurized sealable transportable containers storing a single semiconductor wafer that is adapted to contactless reading of data fixed on the wafer and/or the container.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

DETAILED DESCRIPTION OF THE PREFERRED EMBODIMENT

The COAST Containers

Figure 1:
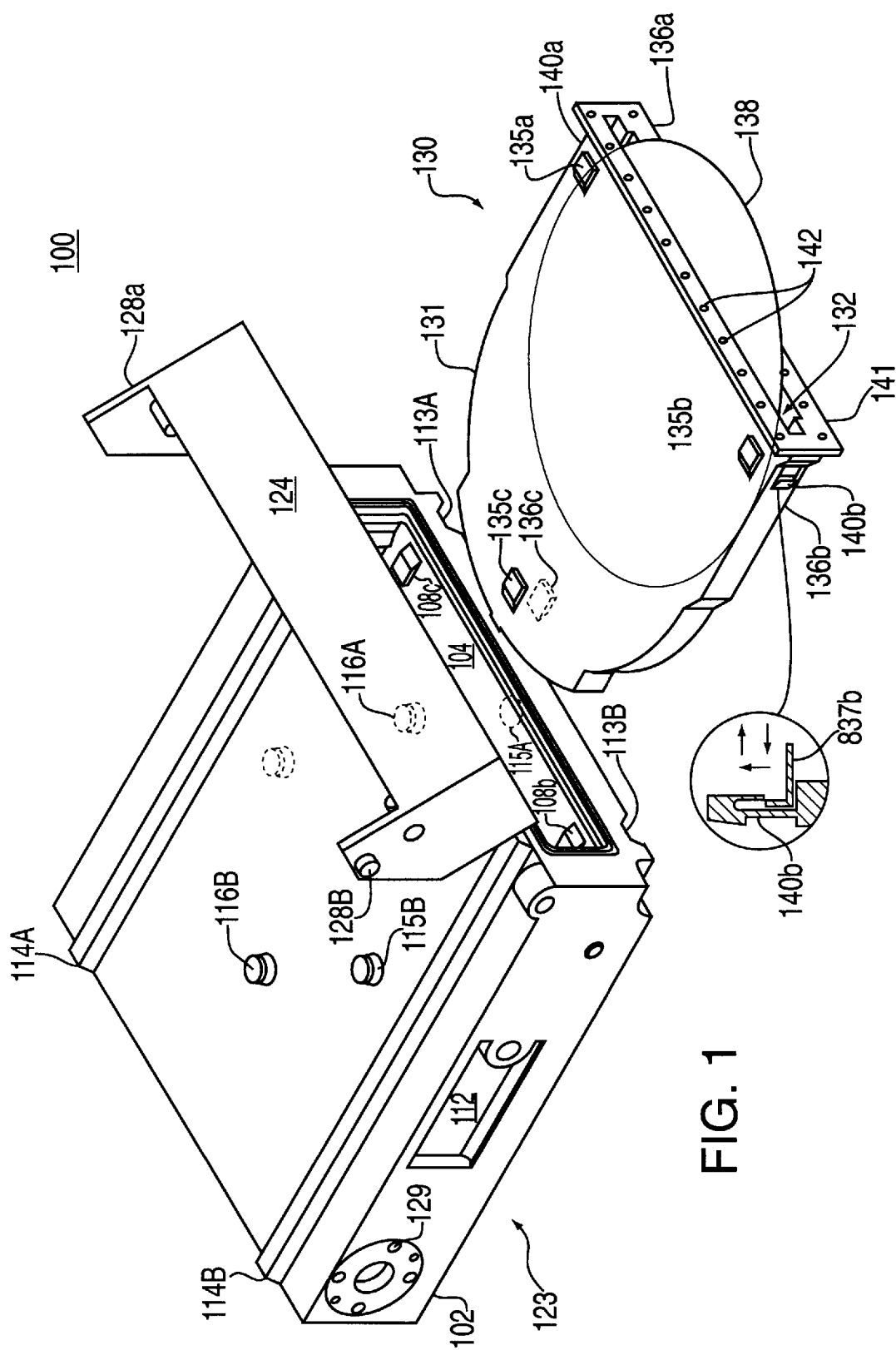
FIG. 1, shows a schematic exploded perspective view of the container base elements: i.e. the cassette-reservoir, the wafer holder and the wafer, according to the COAST concept.

FIG. 1, illustrates the essential elements of the novel pressurized sealable transportable container 100, according to the COAST invention. COAST as stated earlier is an acronym for Contamination-free, global Automation, Single workpiece/wafer Treatment. Basically, it includes a box-shaped cassette reservoir 123, essentially consisting of a housing 102, provided with a slot-shaped access opening 104, normally tightly closed by releasable door means, typically a pivoting cover 124, for hermetic sealing. The pivoting cover 124, has bearings 128a and 128b. As apparent from FIG. 1, the external face of housing bottom has two groove-shaped positioning guides 113A and 113B, crossing its entire surface. Likewise, the external face of the housing top is correspondingly provided with two rails-shaped positioning guides 114A and 114B.

In addition, the external face of the housing bottom is provided with two centering holes 115A and 115B, while the external face of the housing top is correspondingly provided with two centering pins 116A and 116B. These holes and pins are very useful for moving the cassette-reservoir or for clamping it in an accurate position.

The cassette reservoir interior space is filled with an adequate quantity of a pressurized ultra-pure neutral gas. This gas is supplied by a compressed gas supply installation through gas injection valve means 129, (including a quick connect, a non-return valve, and a high efficiency filter). The pressure which prevails in the cassette reservoir interior space has a positive differential pressure (about 5000 Pa) with respect to the outside ambient to prevent any contamination thereof.

The cassette reservoir 123, is preferably made of a transparent and non-contaminating material such as a plastic. It could also be provided with a bar code tag so that identification data attached either to the wafer or the container, could be directly and automatically read by an appropriate reader, then transmitted to the host computer of the Floor Control System.

The cassette reservoir 123, includes a drilled inner wall provided with holes that demarcates two regions within the container interior space: a first region or reservoir in relationship with said gas injection valve means to form the reservoir properly said and a second region or receptacle adapted to receive a wafer holder 130. The cassette reservoir includes means, e.g. 108a and 108b, for firmly and accurately maintaining the holder 130, therein. The wafer holder 130, consists of a casing 131, which has a slot-shaped access or transfer opening 132, enclosing a single wafer 138. The casing 131, could have a plurality of tabs 135a, 135b, 135c, etc., and a ledge or lip 141, having a plurality of holes or openings 142.

Wafer holder 130, is adapted to be inserted in and removed from the said receptacle through the said access opening 132, at the beginning and at the end of the wafer processing step sequence. The lateral sides of casing 131, include resilient tabs 140a and 140b, that engage in corresponding clamping devices (not shown) of housing 102, to accurately lock casing 131, into the interior space of housing 102. Each of the tabs 140a and 140b, have a corresponding declipping means 837a and 837b, respectively. Tabs 140a and 140b, are each provided with an ear, so that the wafer holder 130, is removed from cassette-reservoir 123, at the end of processing, by using a declipping gripper inserted through the slot-shaped access or transfer opening 132.

The wafer holder 130, is provided on its rear face with via-holes that are designed so that the gas flowing from the reservoir into the holder interior space, first through said holes, next through said via-holes, does not so easily penetrate in the holder interior space.

The wafer holder 130, is preferably made of a transparent and non-contaminating material such as a plastic or pure $SiO_2$ (quartz). The wafer holder 130, includes means for softly but firmly maintaining the wafer therein.

In FIG. 1, for the sake of illustration only, the cassette reservoir 123, is represented with pivoting cover 124, in a semi-open position, out of his lodgment, and the wafer holder 130, partially enclosing a wafer 138, not fully inserted in the cassette reservoir 123. Once wafer holder 130, fully enclosing wafer 138, is totally inserted in said receptacle and cover 124, closed for hermetic sealing, container 100 is pressurized and then may be safely transported or stocked. Optionally, cassette reservoir 123, can include upper and lower protective shells (not shown).

As a matter of fact, direct wafer reading may become important in the future of semiconductor wafer manufacturing when very personalized treatment are conducted. One can readily imagine that some typical process parameters will be written directly onto the wafer to be taken in consideration in the subsequent processing steps or even after chip fabrication, e.g. in the field for maintenance. To that end, if some parts of the cassette reservoir 123, i.e. the housing 102, holder 130 and protective shells (if any), are made from an opaque material such as stainless steel, a transparent window 112, may be adapted thereto for direct wafer identification data reading.

In essence, the major characteristic of container 100, is to permanently maintain its interior space containing the wafer holder 130, (enclosing a wafer or not) under pressure and, except short periods of transportation, to be systematically connected to the compressed ultra pure neutral gas supply installation for maximum safety. An ultra-pure neutral gas, such as N2, is introduced therein in a conventional way by inserting a gas injector (connected to the gas supply installation) in the quick connect seal plug of the gas injection means 129 (see FIG. 1). The gas injector consists of a retractable nozzle adapted to said gas injection means. Cassette reservoir 123, could also be readily adapted to store a single wafer in a pressurized protective environment without using wafer holder 130. However, the use of the wafer holder 130, appears to be a requisite as far as high value product wafers (e.g. 64 Mbit and above DRAM chips, VLSI and ULSI bipolar chips) are produced.

Although, the Single Wafer Treatment approach is the essence of the COAST concept and appears to have a bright future, the demand of handling a plurality of wafers for batch processing may still continue, for instance, for GaAs wafers (of smaller diameter sizes when compared to silicon wafers) or for some specific processing steps such as cleaning, hot thermal processing . . . etc. To date, most of the wafer suppliers deliver the raw wafers stored in a carrier, which in turn, is wrapped in a vacuum sealed plastic pocket.

Although container 100, such as described in conjunction with FIG. 1, is perfectly suited for single wafer storing, transport and handling, it can be readily adapted to receive a plurality of wafers should a multiple wafer holder be required. Thus, description of a variant adapted to multiple wafer batch processing is now given with reference to FIGS. 2A and 2B.

Figure 2A:
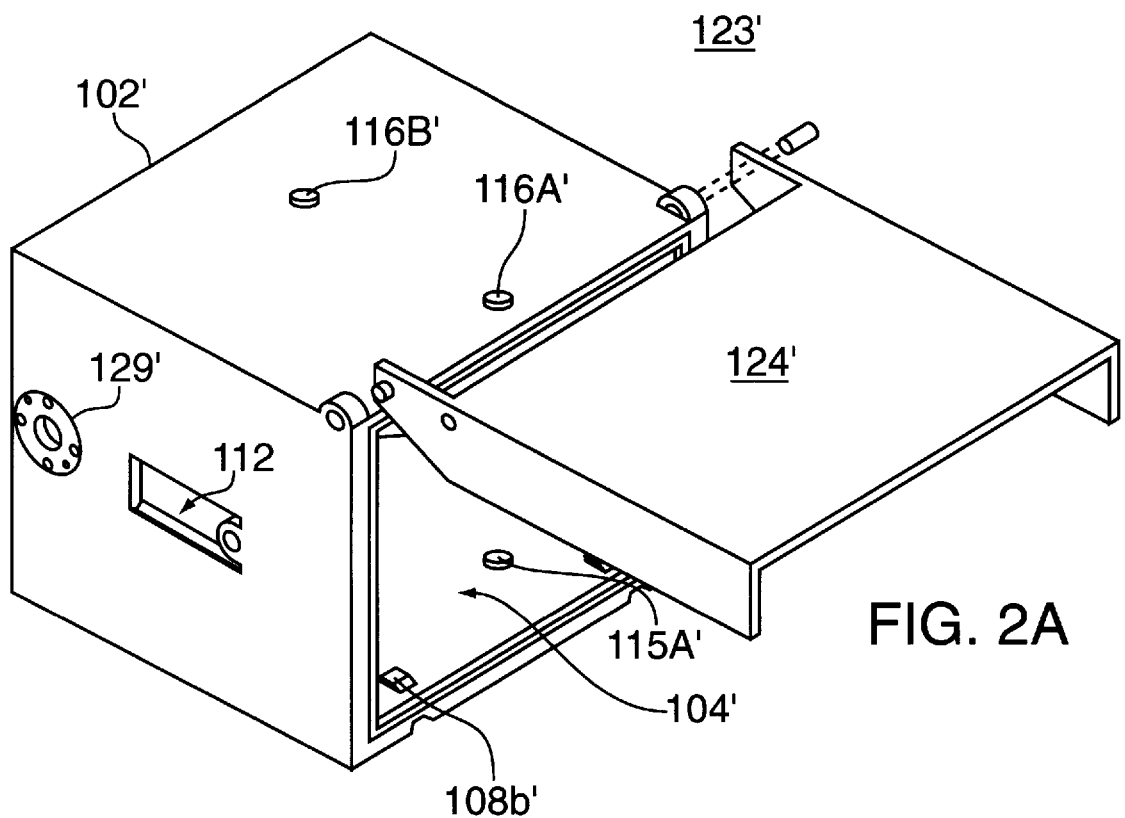
FIG. 2A and FIG. 2B, respectively show the cassette-reservoir and the wafer holder of FIG. 1, when both are adapted to receive a plurality of wafers.
Figure 2B:
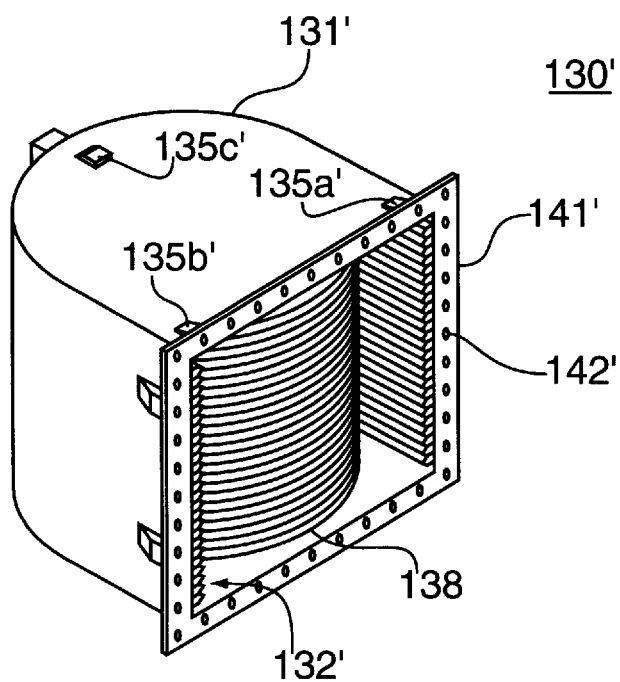

FIG. 2A, schematically shows the substantive elements of cassette reservoir 123 of FIG. 1, now referenced 123', once directly derived therefrom for adaptation to receive the multiple wafer holder 130', of FIG. 2B. In turn, the latter directly derives from the wafer holder 130, of FIG. 1. Corresponding elements bear corresponding references. Note, because of the relatively large volume of access opening 104', it may be worthwhile to use two gas injection valve means 129', on the sides of box housing 102', instead of one.

FIG. 2B, shows the corresponding wafer holder 130', whose casing 131', has been adapted to store a plurality of wafers 138. For sake of simplicity, some details of the housing 102' and of the casing 131' have not been represented in FIGS. 2A and 2B. The casing 131', could have a plurality of tabs 135a', 135b', 135c', etc., and a ledge or lip 141', having a plurality of holes or openings 142'. The slot-shaped access or transfer opening 132', now comprises a series of slots which give a typical castellated shape to its internal lateral sides. Wafer holder 130', of FIG. 2B, is still provided with a set of via-holes (not shown) in correspondence with the slots. Finally, a piece of soft non-contaminating material (not shown) such as polyurethane foam or the like is stuck on the internal face of cover 124' (FIG. 2A), to maintain the wafers clamped in the holder 130', as soon as cover 124', is closed.

As apparent from FIGS. 2A and 2B, only minor adjustments (substantially limited to size changes) are required. However, some processing equipments may be designed to receive commercially available multiple wafer carriers, such as the well-known H-bar models designed and manufactured by FLUOROWARE Inc. In this case, it just suffices to adapt the cassette reservoir 123', thereto.

The COAST Manufacturing Line

Figure 3:
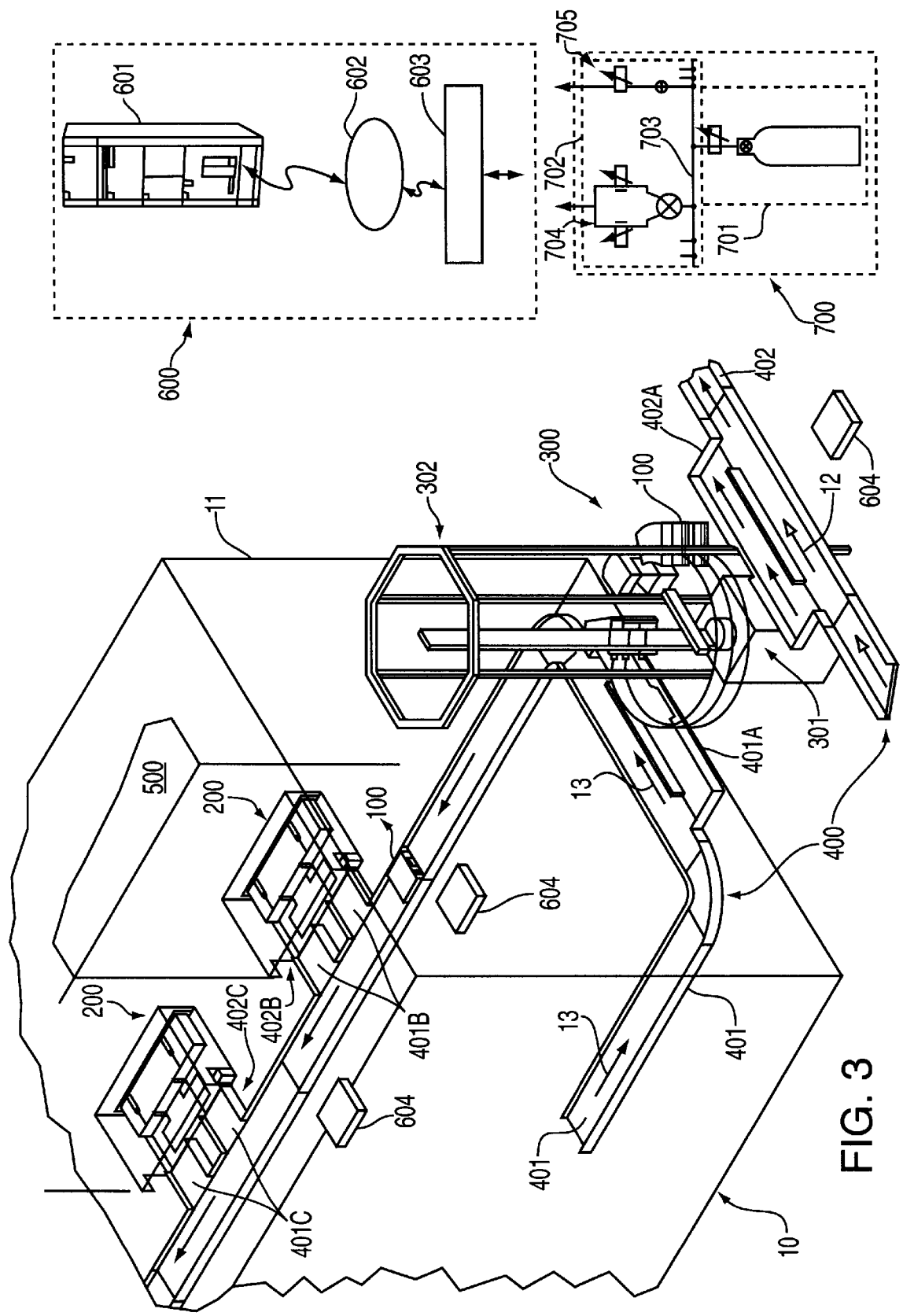
FIG. 3, shows a schematic perspective view of the three innovative base constituents according to the COAST concept: the pressurized sealable transportable containers, the pressurized interface apparatus and the dispatching apparatus with a gas distribution system once integrated with a standard intelligent flexible intra-bay/extra-bay conveyor system and a Floor Computer System (FCS), to form a part of a manufacturing line.

FIG. 3 shows a schematic perspective view of a partial installation dedicated to a determined process area 10, illustrating the three major innovative base constituents of the COAST concept: the containers, the pressurized interface apparatus and the dispatching apparatus. A plurality of containers 100, two interface apparatus 200, and one dispatching apparatus 300, have been illustrated in FIG. 3. The interface apparatus 200, has by-pass stations 402B and 402C.

A flexible intra-bay belt conveyor system 401, ensures container 100, transportation to and from processing equipments 500 (they can be different), within the process area 10.

Conventional computer system 600, comprises a general purpose host computer or a work station 601, a Local Area Network (LAN) 602 and a micro-controller 603, dedicated to this process area 10, for overall operation control. Such a computer system 600, may be referred to as the Floor Computer System (FCS). The micro-controller 603, interfaces with local intelligence distributed in the processing equipments, the dispatching system 300, . . . etc. A plurality of bar code tag readers generically referenced 604, have also been represented in FIG. 3.

Finally, a gas supply installation 700, including a compressed ultra pure neutral gas supply source referenced 701, and a gas delivery block 702, comprising manifold 703, a network of high quality stainless pipes with electropolished interior surface finish, and an adequate number of electro-valves and pressure regulators/controllers for controlled gas flow delivery is also illustrated in FIG. 3. The gas supply installation 700, could also have an fluid delivery system 705. Usage of ultra pure neutral gas totally avoids wafer particulate and chemical contamination. Note that, for sake of simplicity, the gas supply distribution network and the electrical wire network that are required for said overall operation control have not been represented in FIG. 3. As such, FIG. 3 may be considered showing a partial schematic view of a fully automated and computerized conveyor based manufacturing line, typically for semiconductor wafer processing. In addition, for servicing process area 10, an extra-bay conveyor 402, with its by-pass station 402A, is added to service dispatching apparatus 300. Dispatching apparatus essentially consists of a handling robot 301, and a vertical stocker 302, whose supports are connected to the gas supply installation. Conveyors 401 and 402, are respectively the intra-bay and extra-bay elements of a conveyor transportation system 400.

Very schematically, the operation of the partial manufacturing line of FIG. 3, reads as follows. Let us assume that, within the flux of incoming containers 100, transported by the main belt of extra-bay conveyor 402, in the direction of arrow 12, the host computer 601, decides to transfer a specified container 100, into the by-pass station 402A. When this container reaches the input port of by-pass station 402A, a tilt lever or a piston (not shown) pushes this container therein and the container is moved by the secondary belt of by-pass station 402A, until it reaches the central input/output port zone thereof where a lever stops it. Next, the handling robot of handler 301, grasps the container 100, and places it in an unoccupied support station of the vertical stocker 302. It is immediately connected to the gas supply installation via the gas injector means (not shown).

Assuming now this container 100, stored in vertical stocker 302, has to be processed in a processing equipment 500, of process area 10, through a corresponding interface apparatus 200. The container 100, is first released from the gas injector means. Then, the handling robot seizes it and moves it in the central input/output port zone of by-pass station 401A, of intra-bay conveyor 401, where it is laid down. Next, a lever (not shown) pushes the container 100, towards the main belt of conveyor 401. The container 100, is then transported in the direction given by arrows 13 (as illustrated by one container 100, in FIG. 3) until it reaches the input port of by-pass station 401B, in front of the corresponding interface apparatus 200.

The container 100, is then pushed into said input port still using a tilt lever (not shown), then moved towards the IN section rest zone of pressurized interface apparatus 200. As far as the container 100, arrives in the IN section rest zone of interface apparatus 200, it is gripped by a pair of controlled clamping actuator devices, and simultaneously connected to an outlet 704, of said ultra-pure neutral gas supply installation 700.

The container 100, remains in the rest zone of the IN section until processing equipment 500, is available under host computer control. During this period, the nominal pressure is maintained within the interior space of the container 100. In normal operating conditions, the waiting time in the rest zone is quite limited. Following the request from the host computer 601, the container 100, is moved towards the IN section port zone.

The interface apparatus 200, port lid is first raised and, at the end of the movement, the pivoting cover 124, of the container 100 (FIG. 1), is opened and the lateral sides of the cover are slideably engaged into slots formed in the interface apparatus housing. During this step, the gas pressure is momentarily increased in both the container and interface apparatus interior spaces to generate an efficient gas curtain to prevent any intrusion of contaminants therein. At the end of this step, the container access opening 132, is hermetically applied to the IN section port window for an hermetic seal therebetween, ensuring thereby a total continuity between the two internal spaces.

According to COAST concept, because internal space of the container 100, and the one of the interface apparatus are both pressurized, no external contamination may affect the wafer 138, during this whole preliminary step. When desired, the wafer 138, is unloaded from the container 100, by a transfer robot and transferred to the processing equipment 500, typically to the pre-process (or loading) station thereof, then treated in the processing equipment chamber. At the end of the processing, the wafer 138, is available in the post-process (or unloading) station of the processing equipment 500, then transferred again in the port zone of the interface apparatus 200, for subsequent loading in the container 100.

During wafer processing, the empty container 100, is transferred from the IN section to the OUT section. The same procedure as described above is employed due to the presence of a second pair of controlled clamping actuator devices until the container 100, is applied against the OUT section port window, still forming an hermetic sealing therewith.

Another transfer robot picks up the wafer 138, from the processing equipment post-process station, and transfers it into the container 100. Now the second pair of controlled clamping actuator devices move back the container 100, to the rest zone of the OUT section still without breaking the protective environment, for the same reasons as mentioned above. The port lid is closed, in turn, the container pivoting cover 124, (due to drawback springs) is automatically closed, and further locked, hermetically sealing thereby the container interior space. The wafer 138, enclosed therein is again encompassed by a pressurized protective gaseous environment. Finally, upon request made by the host computer 601, container 100, is moved back to the output port of by-pass station 401B, and pushed onto conveyor 401, for further processing or for being stocked again in the vertical stocker 302, of dispatching apparatus 300.

Figure 4:
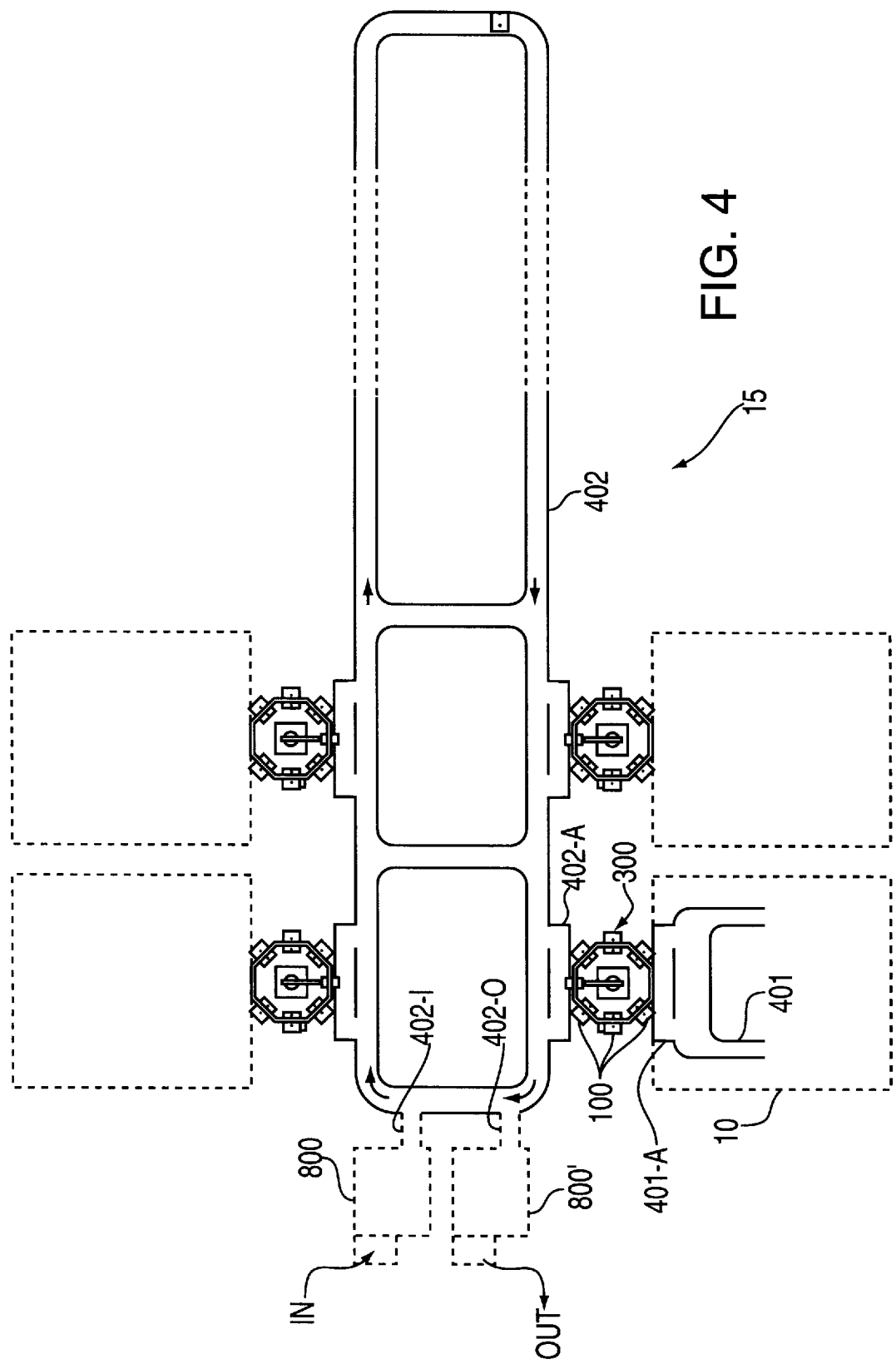
FIG. 4, schematically shows the typical architecture of a fully automated and computerized conveyor based manufacturing line according to the COAST concept.

Now turning to FIG. 4, there is schematically shown a typical manufacturing line architecture bearing numeral 15 adapted to the COAST concept including the above mentioned base constituents around process area 10, such as depicted in FIG. 1. It is organized around a loop-shaped extra-bay conveyor 402, provided with bridges for higher throughputs. Process area 10, is disposed at the exterior of extra-bay conveyor 402, which transports and distributes containers 100, to the adequate processing equipments 500, via by-pass station, such as 402A. For sake of simplicity, only a portion of intrabay conveyor 401, has been illustrated in FIG. 4. Likewise, a few other process areas have been shown in dotted lines. The bar code tag readers of FIG. 1, that are installed at judicious locations of extra-bay and intra-bay conveyors, are not shown in FIG. 4.

The process area 10, is associated with dispatching apparatus 300, which has the regulating role mentioned above and in particular to store the containers and to transfer them to and from conveyors 402 and 401. Optionally, an additional dispatching apparatus, referred to as an input/output dispatching apparatus can be installed to service extra-bay conveyor 402, of process area 10, for higher throughputs according to production simulations. Typically, such dispatching apparatus is manually loaded by the operator. The operations of assembling the container elements are quite similar to the operations described above with respect to the assembling of the SMIF box. Once assembled the container is slideably engaged in a free bin of the stocker and immediately pressurized.

As such, the operations of assembling the container elements to produce an assembled container and the reverse operations of disassembling the same, are thus performed manually by an operator. It is one of the objective of the present invention to have now these operations performed automatically. In essence, the automatic assembler apparatus of the present invention is adapted to automatically perform not only the operations of assembling but also of pressurizing and of loading the assembled pressurized container onto the conveyor under control of the host computer of the FCS. The reverse operations are automatically performed by the disassembler apparatus. The assembler 800, and disassembler 800', apparatus are schematically shown in dotted lines in FIG. 4, and respectively referenced therein by numerals 800 and 800'. They are respectively associated to IN and OUT stations of the conveyor 402, referenced 402-IN and 402-OUT.

The COAST Automatic Assembler/Disassembler Apparatus

The main purpose of the automatic container assembler/disassembler (A/D) apparatus of the present invention is thus to assemble/disassemble the different elements that constitute the container 100, illustrated in FIG. 1, or at least the essential parts thereof i.e. the wafer 138, that is to be treated in the manufacturing line, the cassette-reservoir 123, and the single wafer holder 130. As mentioned above, the use of the single wafer holder is preferred for high quality level semiconductor processing. Other optional elements of the container, such as the protective shells, may be handled as well.

Functionally, the role of the assembler apparatus 800, is four fold. First, it is adapted to be manually and safely filled with the adequate number of the elements mentioned above i.e. the wafers, the cassette-reservoirs, and the single wafer holders.

Second, it includes means for automatically and successively grasping one element of each type, i.e. a cassette-reservoir 123, next a single wafer holder 130, and finally a wafer 138, to be processed, before proceeding to their complete assembly.

Third, once these elements have been properly assembled to result in a container 100, it further includes means to pressurize the interior space of the container 100, with an ultra pure neutral gas, typically nitrogen.

Fourth, it releases the assembled pressurized container onto the IN station 402-IN of extra-bay conveyor 402, and simultaneously informs the host computer (601 in FIG. 3) of the FCS for data initialization, that an identified container/wafer is ready to enter in the manufacturing cycle.

Similar reasoning applies to the disassembler apparatus 800, which exactly performs the reverse steps, to pick-up the containers 100, from the conveyor for disassembling the elements. The treated semiconductor wafer 138, is stored in a jig, while the other elements i.e. the wafer holder 130, and the cassette-reservoir 123, are collected for subsequent cleaning. At this stage, the treated wafer 138, is less sensitive to contamination. As a result, the total protection of the wafer 138, which is sought according to the COAST concept, is achieved as soon as the assembled pressurized container 100, is released outside the assembler apparatus 800, for subsequent treatments of the wafer in the manufacturing line, until it is picked-up by the disassembler apparatus 801, for being disassembled.

As mentioned above, suppliers usually deliver the raw wafers 138, stored in a carrier. Let us assume this carrier is the multiple wafer holder 130', as illustrated, e.g., in FIG. 2. The multiple wafer holder 130, is secured in a transport box which in turn, is wrapped in a vacuum sealed plastic pocket for contamination protection. With wafer diameters exceeding the present 20 cm-diameter, as expected to come in the next future, a single wafer 138, stored in a single wafer carrier instead of a plurality, may become the standard delivery. Consequently, the initial elements to be input in the assembler apparatus 800, are one (or more) multiple wafer holder 130', storing a plurality of wafers 138, a corresponding number of single wafer holders 130, and cassette-reservoirs 123. The cassette-reservoirs 123, and the single wafer holders 130, also delivered wrapped in similar vacuum sealed plastic pockets.

Figure 5:
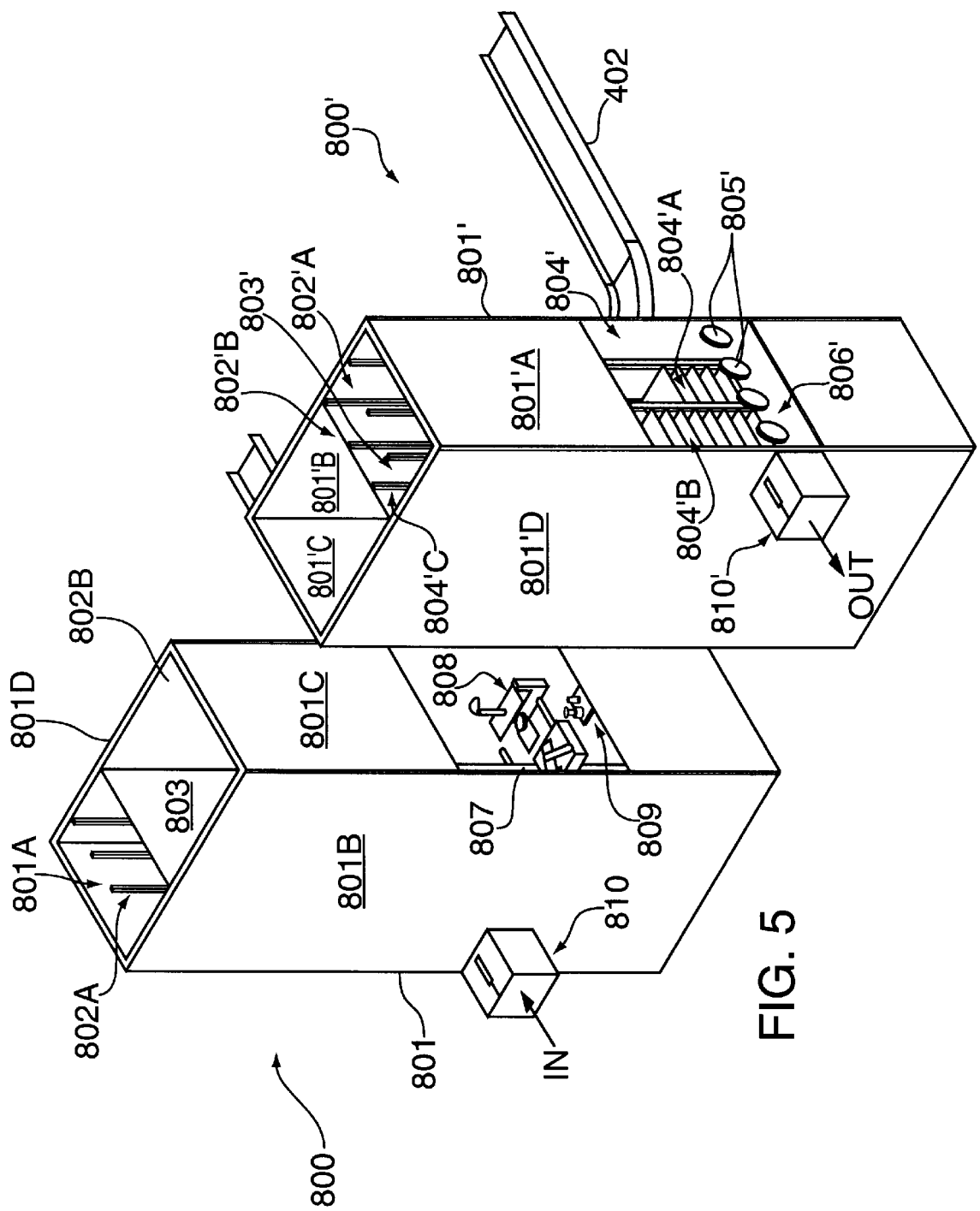
FIG. 5, shows a schematic perspective view of the automatic assembler and disassembler apparatus of the present invention.

Now turning to FIG. 5, there are schematically shown the assembler 800, and the disassembler apparatus 800', that are used to service extra-bay conveyor 402. The assembler apparatus 800, shown in the left of FIG. 5, is basically dedicated to the operations of (1) assembling i.e. to grasp the elements and properly fit them to produce the so called assembled container, (2) pressurizing the assembled container and (3) loading, i.e. to release the assembled pressurized container onto the conveyor. Because all these operations are performed in a clean mini-environment, as it will be explained later on, the wafer 138, is substantially protected against any particulate or chemical contamination. Before loading, the container/wafer is identified by the assembler apparatus and the FCS informed for data initialization.

The disassembler apparatus 800', shown on the right of FIG. 5, is dedicated to the reverse unloading and disassembling operations. The assembler apparatus 800, and the disassembler apparatus 800', are substantially identical, the minor differences existing therebetween will be detailed later on. In that respect, they will be thus described by a common description essentially referring to the assembler apparatus 800.

Assembler apparatus 800, first consists of a cabinet 801, comprised of four lateral walls 801A, 801B, 801C and 801D, and optionally of top and bottom plates, enclosing the various mechanisms that are partially shown in the exploded view of FIG. 5. The top cover plate has been removed for illustration purposes to partially show the interior of the cabinet 801. Top and bottom plates may not be required should a blowing ceiling provided with a high purity filter be provided above cabinet 801. Preferably, the whole interior space of cabinet 801, is submitted to a clean filtered gas flow with an adequate hygrometry degree generated by a blower (not shown), so that a clean gaseous mini-environment is created therein with a light overpressure with regard to the outside ambient. Basically, cabinet 801, comprises two compartments 802A and 802B, separated by partition-wall 803.

Disassembler apparatus 800', has an identical construction in that regard. For the sake of illustration let us consider more particularly the disassembler apparatus 800'. As schematically shown in FIG. 5, through a first exploded portion of cabinet 801', compartment 802'A, includes an elevator structure 804', comprised of three adjacent elevators (804'A, 804'B and 804'C), each facing a pair of manipulation gloves 805'. They are used as a manual port, to allow the operator to manipulate objects in the clean mini-environment of compartment 802'A, that is created as it will be explained below. To that end, cabinet 801', further includes, for example, a partition wall 803', a working table 806', and a transparent window (not shown). Note also, that no special clothing is required for the operator.

Now turning to another exploded portion of FIG. 5, by reference to assembler apparatus 800, there is shown an automatic manipulator mechanism 807, in compartment 802B, whose role is to grasp the different elements of the container 100. A loadlock device 808 is also represented in this portion, it will be referred to as the loading loadlock device 808. It is a key part of assembler apparatus 800, and thus it is provided with a relatively complex mechanism. First, it cooperates with manipulator mechanism 807, for assembling the elements of the container 100. Secondly, it is adapted to pressurize the container 100, once assembled. Finally, it has also the role of identifying the container/wafer for the host computer 601, of the FCS, before releasing the container 100, from the loading loadlock device 808, to the IN station (not shown) of the extra-bay conveyor 402. To that end, device 808, is provided with transfer openings to allow that communication between the interior space of compartment 802B, of cabinet 801, and the outside ambient just above the IN station. A wafer orientation/identification device 809, capable of orienting the wafer 138, and reading the information contained thereupon, is also shown. In the assembler apparatus 800, on the right side of cabinet 801, i.e. on wall 801B, another loadlock device referred to as the input loadlock device 810, is affixed thereon. Its construction is less complicated than the load loadlock device 808. Likewise, it is provided with transfer openings to allow a communication between the outside ambient (where the operator stands), and the interior space of compartment 802A of cabinet 801, just above working table 806. Operator uses this input loadlock device to introduce the container elements inside compartment 802A of cabinet 801, where they can be laid down on the working table 806. As mentioned above, the elements forming the container 100, are not directly available but are supplied wrapped in a vacuum sealed plastic pocket.

In the disassembler apparatus 800', of FIG. 5, the output loadlock device 810' is affixed on the wall, i.e. 801'D. It is used by the operator to extract the container elements, once it has been disassembled in compartment 802'B. The unload loadlock device (not shown) could be affixed on wall 801'B, of disassembler apparatus 800'. It permits a communication between the OUT station (not shown) of extra-bay conveyor 402, and compartment 802'B, when the wafer 138, has completed its full manufacturing cycle. At the end of this cycle, the container 100, is picked-up during the unloading operation before being submitted to the disassembling operation.

Figure 6:
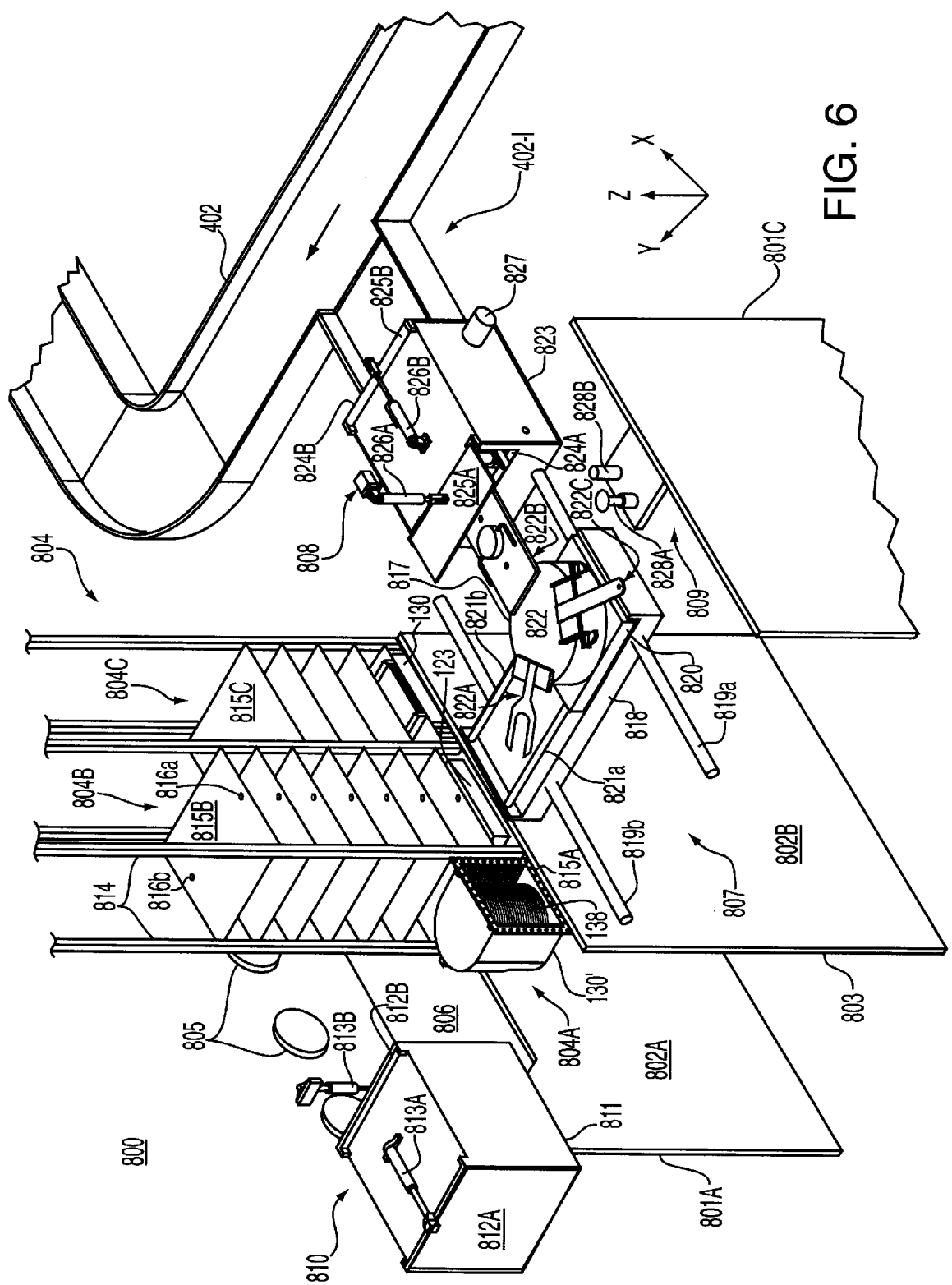
FIG. 6, shows a schematic partially exploded perspective view of the automatic assembler apparatus of FIG. 5.

Cabinet construction details of the assembler/disassembler apparatus will be now given in conjunction with FIG. 6, which illustrates a rear view of a preferred embodiment of the assembler apparatus 800.

Now turning to FIG. 6, input loadlock device 810, essentially consists of a box-shaped casing 811, affixed against wall 801B (not shown), provided with two transfer openings on its front and rear faces. These transfer openings establish a communication between the outside ambient and the interior space of compartment 802A. These transfer openings are respectively closed by doors 812A and 812B, under the control of respective actuators 813A and 813B, that are manually controlled.

Inside the input loadlock device 810, there are an air blower (not shown) that blows a clean air stream to sweep the dust that could have been deposited on the plastic pocket wrapping the elements and a vacuum cleaner (not shown) to evacuate it. The air blower and the vacuum cleaner are operated as soon as a component is introduced in the input loadlock device 810. The latter is designed to allow the transfer of the elements that are necessary to the container assembling operation, from the outside ambient where the operator stands, to the internal space of the assembler apparatus 800.

As mentioned above, these elements comprise at least one multiple wafer holder 130', and an adequate number of cassette-reservoirs 123, and single wafer holders 130. All the plastic pockets will be removed inside cabinet 801, by the operator.

As apparent from FIG. 6, elevator structure is comprised of three independent vertical elevators 804A, 804B and 804C, one for each element. The number of cassette-reservoirs 123, and single wafer holders 130, corresponds to the number of wafers 138, to be assembled that are carried by the multiple wafer holder 130'.

Each elevator consists of a frame, such as, for example, stainless steel frame made of tubes 814, supporting as many support stations or bins 815A, 815B or 815C, generically referenced 815, as required by the production simulations, multiple wafer holder capacity, and the like. Because each elevator is dedicated to handle a specific element, it is adapted thereto. The bins are superposed in vertical columns with an adequate spacing therebetween depending on the element size. The spacing between bins 815B, of the central elevator 804B, is adapted to receive the cassette-reservoirs 123, and the spacing between bins referenced 815C, of the right-most elevator 804C, is adapted to receive single wafer holders 130. For sake of illustration, only one bin 815A, has been illustrated in FIG. 6, to support the multiple wafer holder 130'. However, should large diameter (e.g. 30 cm) wafer be delivered by the supplier, the elevator 804A, would require to be modified. Bins 815A, would not be required, but slots could be made on the internal faces of tubes 814, to receive the wafers (as illustrated by slots of multiple wafer holder 130', depicted in FIG. 2B). The incremental step of elevators 804B and 804C, is given by their respective spacing. Unlike, the incremental step for elevator 804A, is the spacing between two wafers in the multiple wafer holder 130'. On the other hand, the bins of each columns are provided with adequate means for centering and safely maintaining its respective element. For instance, bins 815B, that are the receptacle for cassette-reservoirs 123, are provided with pins 816a and 816b.

Once the operator has slideably engaged a cassette-reservoir 123, between two adjacent superposed bins 815B, to have the holes 115A and 115B of the cassette-reservoir 123, properly aligned and centered with said pins 816a and 816b, the operator then lays down the cassette-reservoir 123, to clamp the cassette-reservoir 123, thereon. Likewise, the multiple wafer holder 130', and the single wafer holders 130, are also properly inserted and clamped on their respective bins, using any appropriate means. For instance, the multiple wafer holder 130', can be clamped by providing bins 815A, with dimples corresponding to the three lower pads the are provided on the external face of the casing bottom (reference numbers 136a, 136b and 136c for the single wafer holder as shown in FIG. 1). The three elevators are arranged in an adjacent manner to give the typical wall-shaped configuration illustrated in FIG. 6. The working table 806, permits the operator to make some manual operations that are required as it will be explained later on.

Figure 7:
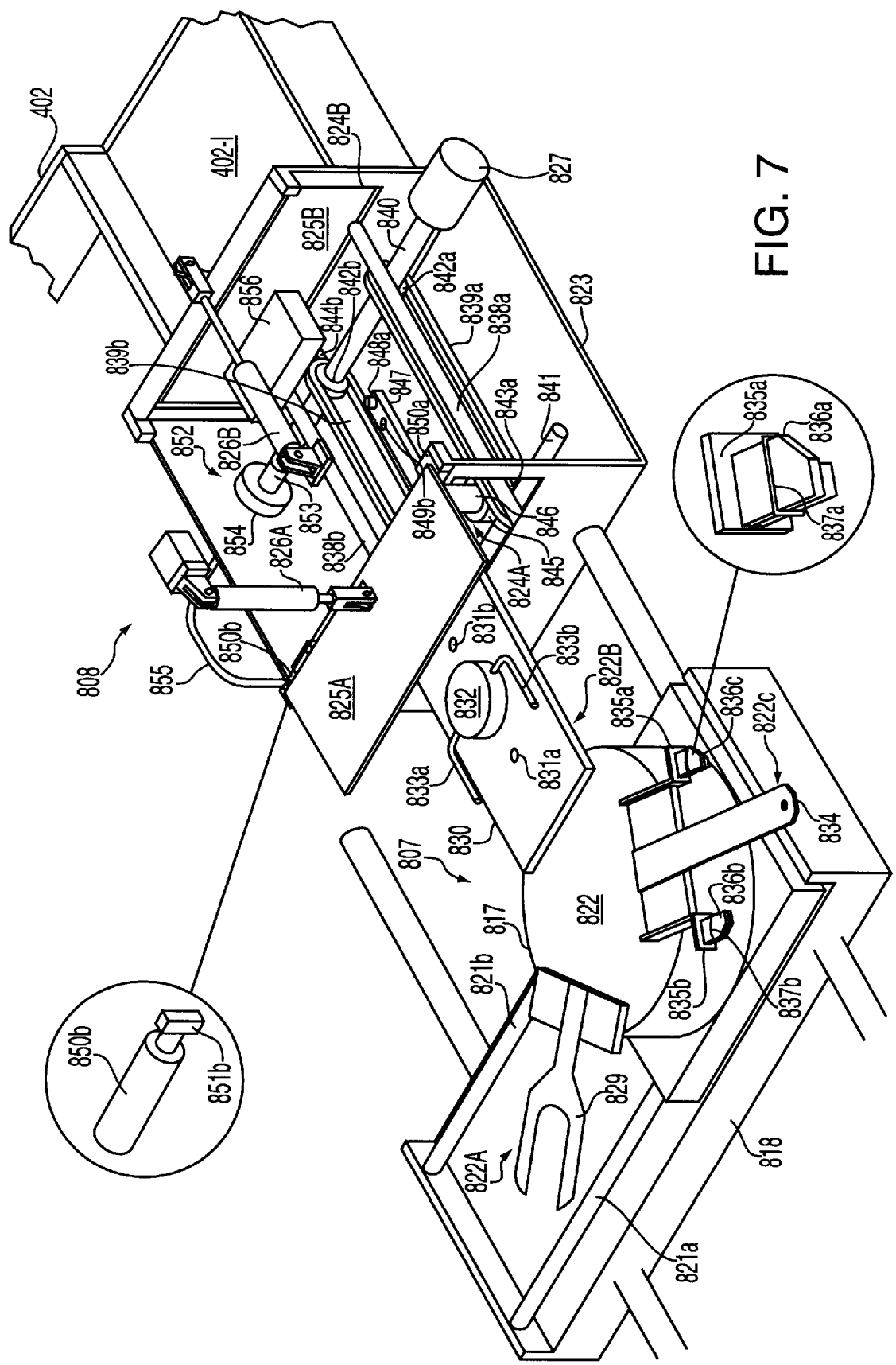
FIG. 7, is a schematic partially exploded and enlarged view of the automatic manipulator and load/unload loadlock device of FIG. 6.

As more clearly seen in FIGS. 6 and 7, automatic manipulator mechanism 807, essentially consists of a rotating handler tool 817, also capable of moving in the Z direction that is supported by an X–Y stage. The latter first includes a cart or table 818, operable to move in the X direction along two rails 819a and 819b. Cart 818, supports another cart 820, operable to move in the Y direction along two rails 821a and 821b. Rotating handler tool 817, essentially consists of a rotating head 822, operable to rotate and to move in the Z direction which is equipped of three different transfer handlers 822A, 822B and 822C. These transfer handlers 822A, 822B and 822C, are oriented at 120° one to another, each being adapted to safely and accurately handle its respective element, i.e. the wafer 138, the cassette-reservoir 123, and the single wafer holder 130.

FIG. 6, also illustrates the load loadlock device 808, which is designed to allow the various elements forming the container 100, to be assembled therein, before being released onto the IN station 402-IN, during the loading operation. Load/unload loadlock device 808, essentially consists of a box-shaped casing 823, provided with front and rear transfer openings 824A and 824B, that are closed by respective doors 825A and 825B. The latter are automatically actuated by jacks 826A and 826B, under the host computer control. It further includes a motor 827, whose role will be explained later. Finally, FIG. 6, also illustrates a wafer orientation/identification device 809, that comprises an orienter 828A, and reading (and possibly a writing) device 828B. The detailed construction of the rotating handler tool 817, and load/unload loadlock device 808, will be given in conjunction with FIG. 7, which shows and enlarged partially exploded view of FIG. 6.

Now turning to FIG. 7, transfer handler 822A, consists of a standard vacuum operated fork-shaped gripper 829, provided with non contaminating plastic pads for soft handling of the wafers. Transfer holder 822B, consists of a plate 830, provided with two holes 831a and 831b, adapted to receive corresponding pins 115A and 115B, of the cassette-reservoir 123 (see FIG. 1), and a suction device 832, connected to a vacuum source via pipes 833a and 833b, to firmly maintain the cassette-reservoir 123, whenever desired. Finally, transfer holder 822C, comprises a vacuum operated paddle 834, and two lateral thrusts 835a and 835b, made integral with lips 836a and 836b, that are adapted to be inserted in the single wafer holder access opening 104. Lips are mounted with declipping means 837a and 837b, to facilitate extraction of the single wafer holder 130, from the cassette-reservoir 123, during the disassembling operation. Declipping means 837a and 837b, typically consists of a L-shaped slide of hard plastic that can be laterally moved. The different movements that are required to slides 837a and 837b, to bend corresponding resilient tabs 140a and 140b, may be understood from the enlarged view of FIG. 1.

FIG. 7, also shows the interior of load loadlock device 808. Two centering rails 838a and 838b, are affixed on the front and rear faces thereof. They are adapted to the groove-shaped positioning guides 113A and 113B, of the container 100, and used to center the container 100, inside the load loadlock device 808. Two timing-belts 839a and 839b, are driven by motor 827, via motor shaft 840, idling shaft 841, gears 842a and 842b, and pulleys 843a and 843b (not shown). The purpose of the belts will be to move the container 100, once assembled, through output transfer opening 824B. To that end, timing-belts 839a and 839b, are provided with a finger 844a (not shown) and 844b, respectively. Actuator device 845, consists of a jack formed by a cylinder and a piston 846, as standard. A metal plate 847 (larger than shown in FIG. 7), having two buttons or pins 848a and 848b (not shown), is fixed on the piston 846. The buttons 848a and 848b, engage in corresponding holes 115A and 115B formed in the external bottom face of cassette-reservoir 123 (see FIG. 1). Metal plate 847, is provided with vacuum pads 849a (not shown) and 849b, connected to a controlled vacuum source (not shown). Actuator device 845, moves the metal plate 847, up and down in the vertical Z direction.

Load loadlock device 808, further includes two small jacks 850a and 850b, actuated under the host computer control, whose role is to open the cassette-reservoir cover 124, by pressing on bearings 128a and 128b (shown in FIG. 1), thereof before the single wafer holder 130, and wafer 138, be inserted therein. To that end, the respective pistons of jacks 850a and 850b, are terminated by skid like pieces 851a (not shown) and 851b, respectively, whose profile is adapted to provide the necessary movement to the bearings 128a and 128b (FIG. 1). The particular hammer-shaped termination of these pieces is shown in one of the partial enlarged views of FIG. 7. Further, load loadlock device 808, includes a retractable gas feeding system 852, which consists of nozzle 853, cylinder 854 and hose 855. Finally, load loadlock device 808, includes an identification system 856, which could be mounted on the rear face of back door 825B.

Cabinets 801 and 801', and associated mechanisms are thus substantially identical, only the loadlock devices and their related transfer openings are implemented at symmetric locations. In addition, output loadlock device 810', may have a different construction with regard to device 810, because the air blower and vacuum cleaner that are implemented in input loadlock device 810, are no longer required. The assembler and disassembler apparatus 800 and 800', are placed either in a room of an average cleanliness atmosphere (in this instance an air blower and a high purity filter are required above cabinet 801, to create a clean mini-environment) or in a clean room.

A typical assembling operation will now be described in conjunction with FIGS. 5, 6 and 7

Let us assume that all the bins are free of elements. The preliminary step thus consists to fill the bins with their respective elements. First of all, the operator opens front door 812A, of input loadlock 810, (back door 812B is closed), and introduces multiple wafer holder 130', carrying a plurality of wafers 138, and closes the front door 812A.

As mentioned above, the multiple wafer holder 130', is generally secured in a transport box, which in turn, is wrapped in a vacuum sealed plastic pocket. The plastic is made of a special material which eliminates outgassing and ESD effects. Preferably, the air blower is energized, as soon as the door 812A, is opened, so that any dirt that could have been deposited onto the plastic pocket is washed out. Then, the operator shuts-off the blower and opens the back door 812B, and catches the plastic wrapped transport box through manipulation gloves 805, and places it upon working table 806. Next, the operator unwraps the plastic pocket that is thrown away through a hole (not shown) provided in working table 806, and collected in a waste basket (not shown). This waste basket which collects all wasted plastic pockets is accessible through a door (not shown) in wall 801A. The transport box is also evacuated through said hole. Finally, the operator inserts the multiple wafer holder 130', in a free bin 815A, of elevator 804A (only one bin 815A, is shown in FIG. 6). This can be repeated if more than one multiple wafer holder is required, but in this case, the elevator 804A, would be provided with the adequate number of bins 815A. The same operation is repeated for the other elements to fill bins 815B and C until the three elevators are adequately filled. Each elevator moves one incremental step when the operator orders this move to have an empty bin in front of him. For instance, the operator pushes a pedal at the bottom of the cabinet to automatically command the desired move.

Once the elements have been stored in their respective bins of the assembler apparatus, the three operations mentioned above may comprise the following steps: (1) grasping one container element of each type, (2) assembling these elements to produce the assembled container, (3) pressurizing the container, (4) initializing the wafer/container data in the host computer of the FCS, and finally (5) loading the assembled and pressurized container onto the IN station of the extra-bay conveyor.

The above sequence of steps will be now described in details. First of all, the head 822, is rotated in order to place rotating handler tool 822B, in front of a bin 815B of elevator 804B. The head 822, being in "up" position on axis Z, so that handler 822B, elevation corresponds to the space interval between the top of the cassette-reservoir and the bottom of the bin just above the cassette-reservoir to be grasped.

Cart 818, is moved on rails 819a and 819b, in the X direction until head 822, is positioned in front of elevator 804B, facing said interval. Simultaneously, cart 820, is moved on rails 821a and 821b, in the Y direction, until plate 830, of handler 822B, is positioned above the cassette-reservoir to have holes 831a and 831b (see FIG. 7), in registration with pins 116A and 116B, of the cassette reservoir 123. Now, head 822, is ordered to descend and the suction device 832, is activated to suck the cassette-reservoir 123.

After the cassette-reservoir 123, has been grasped, the head 822, is raised in the "up" position to release the cassette-reservoir 123, from pins 816a and 816b. Cart 820, is moving backward and cart 818, is moved forward while the head 822, is rotating 90° to present the cassette-reservoir in front of the door 825A, of load loadlock device 808, but spaced therefrom. The door 825A, is opened and cart 818, is actuated in the X direction, so that the cassette-reservoir 123, is introduced through transfer opening 824A, at the right distance from the door 825A, and properly positioned above centering rails 838a and 838b, for perfect registration therewith.

The cassette-reservoir 123, is then gently laid-down on said centering rails 838a and 838b, by a downwards move of head 822. Subsequently (or simultaneously) actuator piston 846, is actuated in the "up" direction by actuator device 845, until plate 847, comes in contact with the cassette-reservoir bottom to engage pins 848a and 848b, in holes 115A and 115B, of cassette-reservoir 123. The latter is then released by putting suction pad 832, to atmosphere, while two vacuum pads 849a and 849b, of plate 847, are operated to suck the cassette-reservoir 123, which is now maintained on rails 838a and 838b, by the combined action of the clamping caused by pins 848a and 848b, and the suction effect caused by vacuum pads 849a and 849b.

Two small jacks 850a and 850b, are then activated to push on the bearings 128a and 128b, of the cover 124, to open it. The head 822, is put in "up" position to release holes 831a and 831b, of plate 830, from pins 116A and 116B, and the cart 818, is moved backward in the X direction.

The manipulator mechanism 807, is ready to reiterate the above described process to successively insert a single wafer holder and a wafer, in this order, with their corresponding grippers. Each time an element is grasped, the corresponding elevator is raised by one incremental step to present another element to the automatic manipulator mechanism 807.

The single wafer holder 130, is grasped and inserted inside the cassette-reservoir and clipped therein. Finally, a wafer 138, is picked-up, laid-down onto orientation device 828A, then properly presented to identification device 828B, for data reading and then inserted in the single wafer holder interior space. Wafer identification data is then sent to the host computer. The different elements constituting the container have now been assembled.

Note that the container door 124, being still open, as soon as the cassette-reservoir has been introduced and clamped, the nozzle 853, of the retractable feeding system 852, is inserted in the quick connect of the gas injection valve means 129, of the container and a flow of ultra pure neutral gas of about 0.35 m/s is dispensed inside to enclose the wafer in a protective ambient. Head 822, is moved backward and jacks 850a and 850b, are controllably activated to close container door 124, smoothly under action of skid like pieces 851a and 851b. In turn, front door 825A, is closed by activating the jack 826A. Now, all elements composing the container have been assembled and the interior space thereof pressurized, the container data are read by identification device 856, so that the final wafer/container data are entered in the host computer for initializing the manufacturing cycle of the wafer. Finally, the assembled pressurized container is ready to be released onto the IN station 402-IN, of conveyor 402.

Let us detail now this final step of loading. When the FCS gives the order to release the container 100, onto the IN station 402-IN, the nozzle 853, is disconnected, then the back door 825B, is opened. As soon as back door 825B, is opened, gas feeding system 852, is activated to create a small overpressure within the load loadlock device 808 interior space to prevent any ingress of contaminant therein. At the same time, metal plate 847, is moved downwards in order to retract pins 848a and 848b, and simultaneously the vacuum applied to pads 849a and 849b, is cut and the motor 827, energized. Upon activation of timing-belts 838a and 838b, respective fingers 844a and 844b, push the container 100 on the IN station 402-IN, of conveyor 402. When the container 100, has been released, the back door 825B, is closed by activating jack 826B. As soon as the container 100, is released onto IN station 402-IN, another assembling operation can be conducted.

When a wafer has finished the last step of the manufacturing cycle, the FCS gives the order to send the container 100, to the OUT station 402-OUT, of the conveyor 402, for unloading. All the bins of disassembler apparatus 800', are free, except one bin 815'A, which supports an empty multiple wafer holder of the same capacity that the one stored in assembler apparatus 800.

Upon request of the FCS, the container is pushed by a lever (not shown) in the interior space of unload loadlock device 808', through back door 825'B, which has been previously opened. Then, back door 825'B, is closed and the disassembling operation of the container is performed to automatically extract the container elements.

The disassembling operation basically consists of the reverse steps with respect to the assembling operation described above. First of all, the wafer is grasped and stored in the said empty multiple wafer holder. Then, the single wafer holder is extracted using same declipping means as mentioned above. Finally, the cassette-reservoir is also grasped.

The cassette-reservoirs and the single wafer holders are stored in their respective bins 815'B and 815'C, of elevator 804'. Note that, because no step of depressurization is required, unload loadlock device 808', differs from load loadlock device 808, in that it is not provided with gas feeding system 852. When the multiple wafer 130', is full, the operator wraps it in a plastic pocket through the manipulation gloves 805'. Next, the operator extracts the pocket from the disassembler apparatus 800', via output loadlock device 810'.

The treated wafers carried by the holder are now ready for further processing steps (if any) outside the manufacturing line, e.g. chip testing, dicing, picking, and the like. Likewise, the cassette reservoirs and single wafer holders are collected by the operator in a waste basket for subsequent cleaning.

Of course, for a full automated operation of a manufacturing line under the FCS control, processing equipments must be adapted in the future to provide all necessary data/information (that are now partially supplied to operators) in a form useable by the FCS and conversely, be responsive to it. These data include parametric process data collected during wafer processing, equipment availability data (down, waiting for wafer, processing completed, processing in full course, . . . ), in-situ control data, and set-up data.

What is further required is a dynamically controlled movement to eliminate or at least significantly reduce the idle times, to comply with the CFM concept, and finally operate in the mode of "just-in-time" management. The FCS should know the history identity and status of all the intervening parties: wafers, equipments, fluids, . . . in the factory. The FCS moves the containers at the right time to the conveyors then to equipments for further wafer processing based on availability and wafer processing scheduling. The FCS must be real time in nature and must operate without human intervention to avoid processing errors that are a major yield detractor. Situations where an equipment languishes idle for extended periods of time in waiting for a wafer to be processed or because after processing the wafer has not been removed from the equipment, contributes to a loss of efficiency in the manufacturing continuous work flow. To achieve an autonomous and real-time automated FCS, all this information must be captured electronically.

The COAST manufacturing line 15, of FIG. 4, when implemented with the assembler/disassembler apparatus of the present invention, is thus fully automated and computerized, from the very beginning, at the raw wafer stage. Moreover, identification and initialization of the FCS is completed as soon as the wafer is loaded onto the conveyor by assembler apparatus 800. Determination at any time of the physical location and status of containers/wafers, because each container is provided with an identification tag and the conveyors are judiciously equipped with adequate readers. As a result, the containers are permanently tracked and identified by the FCS, irrespective of being transported by the conveyors, stored in a dispatching apparatus, or processed in a processing equipment. Note that the novel containers are perfectly suited for direct wafer data identification reading.

Potential Applications of COAST

First of all, major applications can obviously be found in the semiconductor device manufacturing, not only in the fabrication of chips as described above, but also in the fabrication or the handling of raw wafers, photomasks, reticles . . . that are extensively used in this industry.

The COAST concept can also find obvious and direct applications in other fields of the technology, e.g. ceramic substrates, compact discs (CDs)-audio or ROM, magnetic disks, . . . etc.

More generally, it goes without saying that the novel pressurized sealable transportable containers, the novel pressurized interface apparatus, the novel dispatching apparatus with a gas distribution system, and finally the novel fully automated and computerized conveyor based manufacturing lines deriving therefrom can also be applied everywhere any contamination-free workpiece fabrication is required. In others words, where the fabrication of workpieces under conditions appropriate for an ultra clean facility is necessary, without requiring the huge clean room facility and dramatic related investments. For example, it is possible to extend the COAST concept for fabricating medicines, foods, chemicals, . . . and to use it in the fields of genetic engineering, virology and the like.

While the present invention has been particularly described, in conjunction with a specific preferred embodiment it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A disassembler apparatus for automatically disassembling an assembled COAST container comprising a plurality of elements including a cassette-reservoir, a wafer holder, and a semi-conductor wafer, therein; said apparatus is operable in an average cleanliness room and comprises:

a cabinet, having a front wall, a back wall, and two side walls defining at least one compartment;

a conveyor an unload loadlock mechanism acting as an interface between said cabinet and said conveyor, and unload loadlock mechanism is further provided with a transport mechanism for transporting said assembled COAST container from an IN station of said conveyor into said cabinet;

vertical stocker means mounted inside said cabinet are provided with different types of bins, and wherein each of said bins accommodate one of said elements of said COAST container;

an automatic manipulator mechanism inside said cabinet cooperates with said unload loadlock mechanism for automatically disassembling said COAST container, by successively grasping one of said elements of said COAST container and placing them in their respective bins in said stocker means, and thereby said disassembler apparatus automatically disassembles said assembled COAST container.

2. The disassembler apparatus of claim 1, further comprising at least one manipulating means for manipulating said elements inside said cabinet and for removing said elements from their respective bins within said stocker means.

3. The disassembler apparatus of claim 1, further comprising at least one air circulating means for blowing clean air from said cabinet so as to create a clean mini-environment therein with a light overpressure with regard to an outside ambient.

4. The disassembler apparatus of claim 1, further comprising output loadlock means for extracting said elements from inside of said cabinet.

5. The disassembler apparatus of claim 1, further comprising air circulating means for blowing clean air from top of said cabinet to its bottom so as to create a clean mini-environment therein with a light overpressure with regard to an outside ambient.

6. The disassembler apparatus of claim 5, wherein said air circulating means comprises a blower assembly, a filter and hygrometry control means that are secured within said cabinet.

7. The disassembler apparatus of claim 1, further comprising a wafer orientation and identification means inside said cabinet for reading identification data recorded on said wafer.

8. The disassembler apparatus of claim 7, wherein said identification means further includes means for writing onto said wafer.

9. The disassembler apparatus of claim 1, further comprising a working table for supporting said elements when introduced in an interior space of said cabinet.

10. The disassembler apparatus of claim 9, further comprising at least one manipulating means, said at least one manipulating means consists of a plurality of manipulation gloves to allow the handling of said elements by an operator.

11. The disassembler apparatus of claim 1, wherein said stocker means further comprises three elevators, each elevator being provided with a plurality of bins whose spacing and design accommodate one of said elements.

12. The disassembler apparatus of claim 11, wherein said elevators may be moved incrementally either downwards of upwards under manual control.

13. The disassembler apparatus of claim 1, further comprises a partition wall which in combination with said vertical stocker means delineates two compartments inside said cabinet.

14. The disassembler apparatus of claim 1, wherein said unload loadlock mechanism further comprises communication means with a host computer controlling a manufacturing line for process initialization.

15. The disassembler apparatus of claim 1, wherein said manipulator mechanism further comprises at least one rotating head, said rotating head being movable in X, Y and Z directions.

16. The disassembler apparatus of claim 15, wherein said rotating head is provided with a plurality of handling grippers, and wherein each handling gripper safely grasps and handles said elements of said COAST container.

17. The disassembler apparatus of claim 1, wherein said COAST container is a pressurized COAST container.

* * * * *